United States Patent [19]
Uchida et al.

[11] Patent Number: 5,454,346
[45] Date of Patent: Oct. 3, 1995

[54] PROCESS FOR GROWING MULTIELEMENT COMPOUND SINGLE CRYSTAL

[75] Inventors: Masayuki Uchida; Kenji Kohiro; Osamu Oda, all of Toda, Japan

[73] Assignee: Japan Energy Corporation, Tokyo, Japan

[21] Appl. No.: 194,507

[22] Filed: Feb. 10, 1994

[30] Foreign Application Priority Data

Feb. 12, 1993 [JP] Japan .................. 5-046081

[51] Int. Cl.$^6$ .................................. C30B 11/08
[52] U.S. Cl. .................. 117/13; 117/83; 117/937; 117/223
[58] Field of Search .................. 117/13, 17, 78, 117/81, 83, 233, 224, 937, 955; 423/229

[56] References Cited

FOREIGN PATENT DOCUMENTS 61-158897   7/1986   Japan .
62-003097   1/1987   Japan .

OTHER PUBLICATIONS

Paper Presented at 6th Conf. on Semi–insulating III–V Materials, Canada, 1990 Chapt. 3, pp. 199–204, 1990. W. A. Bonner, et al.
"Growth of ternary In$_x$Ga$_{1-x}$As bulk crystals with a uniform composition through supply of GaAs"; Nakajima et al; J. Cryst. Growth 113(1991) pp. 485–490.
Research Report of Sizuōka Univ., Elec. Eng. Inst., vol. 20, pp. 193–197, 1985, Tokuzo Sugegawa, et al.
Journal of Crystal Growth 112 (1991) 33 38 LEC growth of InGaAs . . . Toshihiro Kusunoki, et al.–Dec. 31, 1990.
Journal of Crystal Growth 113 (1991) 485–490, Growth of ternary In$_x$Ga$_1$ . . . Kazuo Nakajima, et al.–Nov. 15, 1990.

Primary Examiner—R. Bruce Breneman
Assistant Examiner—Felisa Garrett
Attorney, Agent, or Firm—Birch, Stewart, Kolasch & Birch

[57] ABSTRACT

A process for growing a multielement compound single crystal, includes the steps of placing a crucible holding a raw multielement compound of a predetermined set of composition ratios Y in a vertical crystal growing furnace having a heater, melting the raw multielement compound held in the crucible with the heater to produce a melt of the raw multielement compound in the crucible, controlling the output of the heater to grow a multielement compound single crystal of a predetermined set of composition ratios X from the melt so that the melt is solidified successively upwards from part of the melt in contact with the bottom of the crucible, and feeding to the melt as a solute at least one element of the raw multielement compound from above the level of the melt in the crucible so as to maintain the predetermined set of composition ratios X of the solute during growth of the multielement compound single crystal. The process can keep constant the composition of the grown multielement compound single crystal. The process is applicable to the growth of multielement compound semiconductor single crystals and multielement compound oxide single crystals.

7 Claims, 1 Drawing Sheet

5,454,346

PROCESS FOR GROWING MULTIELEMENT COMPOUND SINGLE CRYSTAL

BACKGROUND OF THE INVENTION

1. Field of the Invention

The present invention relates to a process for growing a multielement compound single crystal. It relates more particularly to a process for growing a ternary compound semiconductor single crystal, e.g., indium gallium antimonide (In, Ga)Sb, indium gallium phosphide (In, Ga)P, indium gallium arsenide (In, Ga)As or indium arsenic phosphide In(As, P), or an oxide single crystal, e.g., β-barium diboron tetroxide β-$BaB_2O_4$, dilithium tetraboron heptoxide $Li_2B_4O_7$ or lithium triboron pentoxide $LiB_3O_5$.

2. Description of the Related Art

Since material values, such as lattice constants and forbidden energy band width, of a multielement compound single crystal can be selected by means of changing composition ratios of elements of the multielement compound single crystal, the multielement compound single crystal is now attracting attention as a substrate for epitaxy.

In growing the multielement compound single crystal, the concentration of an element of a high segregation coefficient in a melt of a raw material, however, decreases, so that a bulk multielement compound single crystal of a uniform composition cannot be grown. For example, indium gallium arsenide (In, Ga)As was grown by the liquid encapsulated Czochralski method and has been reported (Paper Presented by W. A. Bonner et al., of 6th Conf. on Semi-insulating 3–5 Materials, Toronto, Canada, Chapter 3, PP. 199–204, 1990). This example does not present a single crystal of a uniform composition along the growth axis of the single crystal.

In addition, a process has been reported which comprises the steps of growing indium gallium antimonide of a uniform composition and concurrently feeding a volume of a solute to cancel a variation in the composition of a melt of a raw material. The solute is fed from a solute container mounted on the underside of a crucible through the bottom of the crucible. This is a single crystal growth process in which the liquid encapsulated Czochralski method and the solute feed control method are combined (Research Report of Sizuoka University, Electronic Engineering Institute, vol.20, PP. 193–197, 1985 and Japanese Unexamined Patent Application Publication SHO.62-3097). This process has drawbacks since it is difficult to control the dissolution rate of the solute in the melt, it is difficult to control the composition of the melt during growth of the single crystal, and it is impossible to stably grow the single crystal of a uniform composition.

In growing the single crystals of ternary oxides, e.g., potassium titanium oxide phosphate $KTiOPO_4$, β-barium diboron tetroxide β-$BaB_2O_4$, dilithium tetraboron heptoxide $Li_2B_4O_7$ and lithium triboron pentoxide $LiB_3O_5$, the flux method is usually employed. However, the flux method has a drawback in that the composition of a melt of a raw material varies as the single crystal is grown.

SUMMARY OF THE INVENTION

In view of the problems described above, an object of the present invention is to provide a process for stably growing a multielement compound single crystal of a uniform composition.

In order to achieve the object, the present invention comprises the steps of placing a crucible holding a raw multielement compound semiconductor of a predetermined set of composition ratios Y in a vertical crystal-growing furnace having a heater, placing an encapsulating agent on the level of the melt in the crucible, melting the raw multielement semiconductor compound held in the crucible by the heater to produce a melt of the raw multielement compound semiconductor in the crucible, controlling the heater power to grow a multielement compound semiconductor single crystal of a predetermined set of composition ratios X from the melt so that the melt is solidified successively upwards from part of the melt in contact with the bottom of the crucible, and feeding as a solute a polycrystal multielement compound semiconductor of the same composition as the grown multielement compound semiconductor single crystal to the melt from above the level of the melt so as to keep the predetermined set of composition ratios X of the melt during growth of the multielement compound single crystal, the level of the melt having a sufficient distance from the growth front of the grown multielement compound semiconductor single crystal to prevent said feeding step from disturbing the growth front.

In the inventive process, since the polycrystal solute is fed and melted during growth of the single crystal in order to prevent the set of the composition ratios of the melt from varying due to differences between the segregation coefficients of the elements of the multielement compound, the composition ratios of the melt are constant during growth of the multielement compound single crystal.

In addition, since the feed position of the solute is different from the position of a growing interface or front of the grown multielement compound single crystal, the inventive process can prevent a growing-interface control from a disorder due to feeding the solute and stably grow the multielement compound single crystal. Thus, the composition of the growing single crystal can continuously be regulated to a target composition determined by an initial composition of the melt of the raw multielement compound when growth of the multielement compound single crystal is started, so that the multielement compound single crystal can be stably grown.

Other objects, features and advantages of the present invention will be apparent from a consideration of the following description, taken in connection with the accompanying drawing.

DETAILED DESCRIPTION OF PREFERRED EMBODIMENT

An embodiment of the present invention will be described with reference to the drawings hereinafter.

Figure 1A:
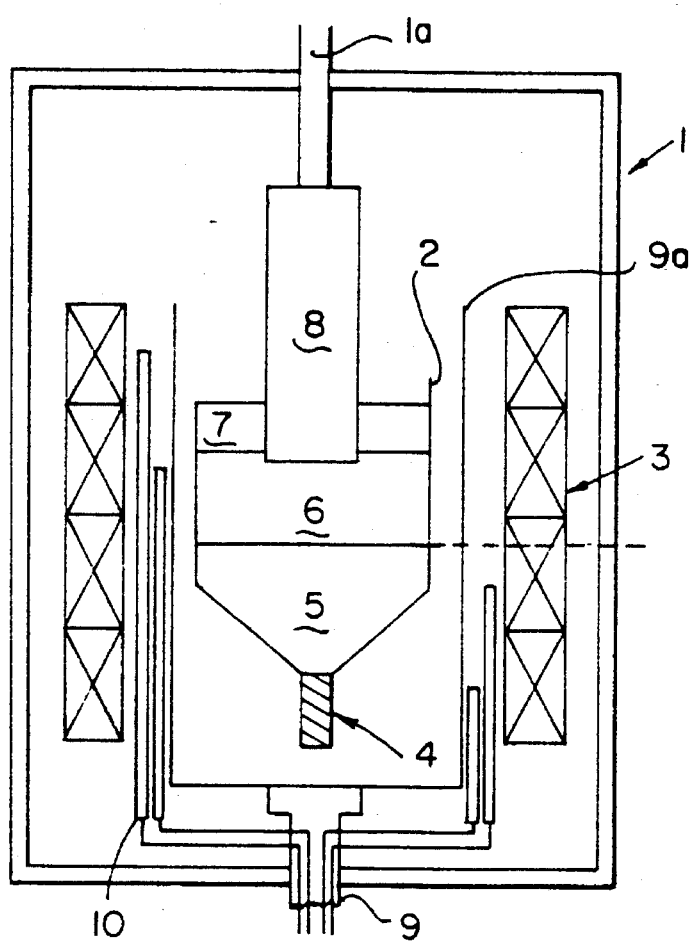
FIG.1 is a schematic diagram illustrative of a process for growing a multielement compound single crystal according to the present invention.
Figure 1B:
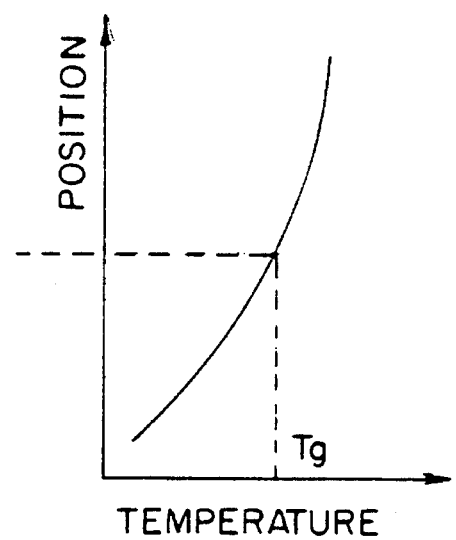

FIG.1 is a schematic diagram illustrative of a process for growing a multielement compound single crystal according to the present invention.

A vertical crystal-growing apparatus for a multielement compound single crystal has essentially the same structure of a VGF (Vertical Gradient Freezing) furnace.

The vertical crystal-growing apparatus comprises a high-pressure container 1 hermetically closed and including the top wall and the bottom wall, a rotatable and vertically movable rod 1a hermetically passing through the top wall of the high-pressure container 1 from above, a crucible 2 rotatably supported within the high-pressure 1, a susceptor 9a surrounding the sidewall of the crucible 2, a heater 3 surrounding the sidewall of the susceptor 9a, and a plurality of temperature sensors 10 placed to and extending along the sidewall of the susceptor 9a.

The crucible 2 holds a melt 6 of the raw multielement compound. The bottom of the crucible 2 has a rod-shaped seed crystal 4 providing a growth nucleus of a multielement compound single crystal to be grown. The crucible 2 is mounted on a rotatable rod 1a. The crucible holds a layer of a grown multielement compound single crystal 5, a layer of the melt 6, and a layer of an encapsulating agent 7 sequentially upwards from the bottom thereof.

The temperature sensors 10 continuously monitor the temperatures of a plurality of positions in the interior of the susceptor 9a along the susceptor 9a. The vertical crystal-growing apparatus automatically controls the temperature distribution of the interior of the crucible 2 to a predetermined pattern shown in FIG. 1 to provide a predetermined temperature distribution to the melt 6.

The rod 1a has a polycrystal solute 8 passing through the layer of the encapsulating agent 7 and being in contact with the melt 6. The solute 8 prevents the composition of the melt 6 from varying during growth of the multielement compound single crystal 5. The high-pressure container 1 contains an atmospheric gas of a high-pressure in order to prevent the solute 8 from decomposing and the melt 6 from being volatilized.

The growth of a single crystal of indium gallium arsenide:(In, Ga)As, a ternary compound semiconductor, using the crystal-growing apparatus will be described hereinafter.

Figure 2:
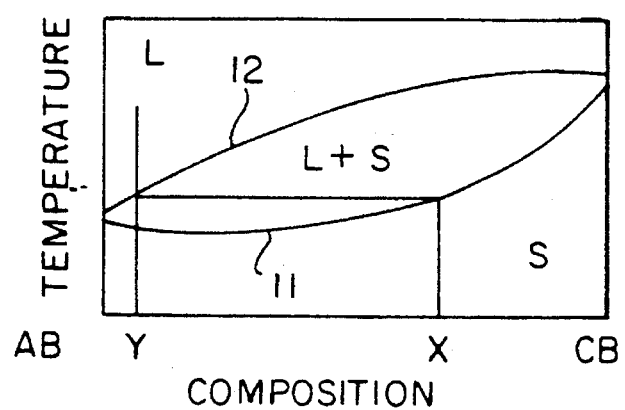
FIG.2 is a graph of a solid phase-liquid phase equilibrium of a ternary compound semiconductor.

As an example, the mixed crystal of the ternary compound semiconductor $(In_{0.1}Ga_{0.9})As$ is grown. The crystal-growing apparatus melts indium arsenide InAs constituting a binary compound semiconductor and gallium arsenide GaAs constituting a binary compound semiconductor in a high-pressure container 1 to produce indium gallium arsenide $(In_{0.1}Ga_{0.9})As$ so that the composition of indium gallium arsenide has a set of composition ratios Y above the liquidus 12: $(In_{0.55}Ga_{0.45})As$ of the melt 6 balanced with a set of composition ratios X above the solidus 11: $(In_{0.1}Ga_{0.9})As$, as shown for example in FIG. 2.

Subsequently, the melt 6 constituting a starting material and the liquid encapsulating agent are placed in the crucible 2. The melt 6 is heated to a temperature higher than a growth start temperature T associated with the liquidus at the set of composition ratios Y in FIG. 2, 1130°–1200° C. in the present embodiment, to produce a uniform molten starting material.

The polycrystal solute 8A has a cylindrical form and is produced by rapidly cooling and solidifying a ternary melt of the same composition as the target composition of the mixed crystal $(In_{0.1}Ga_{0.9})As$. In the step of producing the melt 6 as the starting material, the polycrystal solute 8 is held at a position where it receives almost no heat from the heater 3. The temperature of the interface between the melt 6 and the seed crystal 4 is gradually reduced to the growth start temperature T. Immediately before the start of the crystal growth, the polycrystal solute 8 is contacted with the melt 6.

The seed crystal 4 of gallium arsenide GaAs has the growth orientation (100) and a 4-mm diameter. The crystal-growing apparatus starts growth of the multielement compound single crystal while controlling the in-furnace temperature distribution so that the temperature of the bottom of the crucible 2 is first reduced and has the lowest level in the temperature distribution as shown in FIG.1.

In conditions of the multielement compound single crystal growth, the rotational speed of the crucible 2 is 5 rpm and the growth rate of the single crystal 5 is 0.4 mm/hr. During growth of the single crystal 5, the crystal-growing apparatus continuously monitors the solidified melt ratio of the single crystal 5 determined by the in-furnace temperature distribution control from the diameter of the crucible 2 and the computation of the growth rate, while controlling the immersion depth of the polycrystal solute 8 immersed into the melt 6 so that the composition of the melt 6 is constant.

Thus, the crystal-growing apparatus grows a cylindrical single crystal of indium gallium arsenide having the target composition: $(In_{0.1}Ga_{0.9})As$ and the main body with a 50-mm crystal length. Deviations in the composition in the growth direction and radial direction of the grown single crystal are evaluated by the electron probe microanalysis (EPMA). The composition ratio of gallium in the single crystal 5 is 0.9±0.03 over the length of the grown single crystal 5 except the part of the single crystal 5 in contact with the seed crystal 4 of gallium arsenide. The deviation in the composition ratio of gallium is within the measuring precision of the EPMA in the radial direction of the main body of the grown single crystal.

In a pseudobinary diagram representing the equilibrium between the solid and liquid phases of the ternary compound semiconductor, selecting an appropriate growth temperature and an appropriate composition of the molten starting material enables the application of the present invention to produce a single crystal of the bulk multielement mixed crystal.

The above embodiment of the present invention employs a seed crystal. However, the grown single crystal may alternatively be spontaneously produced on the bottom of the crucible.

The above embodiment of the present invention describes production of a multielement compound semiconductor single crystal. The present invention is also applicable to a multielement oxide single crystal and the prevention of a segregation of the impurity when an impurity is added to a binary compound single crystal.

The present invention is not restricted to the embodiments described above. It is to be understood that a person skilled in the art can easily change and modify the present invention without departing from the scope of the invention defined in the appended claims.

What is claimed is:

1. In a process for growing a multielement compound single crystal using a vertical crystal-growing furnace having a crucible and a heater, the process for growing the multielement compound single crystal comprising the steps of:

placing a raw multielement compound of a first set of composition ratios Y in the crucible;

placing the crucible holding the raw multielement compound in the vertical crystal-growing furnace;

melting the raw multielement compound held in the crucible with the heater to produce a melt of the raw multielement compound in the crucible;

controlling the output of the heater so as to grow a multielement compound single crystal of a second set of composition ratios X from the melt so that the melt is solidified successively upwards from the bottom of the crucible; and feeding to the melt as solute at least one element of the raw multielement compound from above the level of the melt in the crucible to prevent the set of composition ratios of the melt from varying due to growth of the multielement compound single crystal, whereby the second set of composition ratios X of the multielement compound single crystal is constant during growth of the multielement single crystal.

2. A process for growing a multielement compound single crystal, comprising the steps of:

placing a crucible holding a raw multielement compound of a first set of composition ratios Y in a vertical crystal-growing furnace having a heater;

melting the raw multielement compound held in the crucible with the heater to produce a melt of the raw multielement compound in the crucible;

controlling the heater power so as to grow a multielement compound single crystal of a second set of composition ratios X from the melt so that the melt is solidified successively upwards from part of the melt in contact with the bottom of the crucible; and feeding as solute to the melt the raw multielement compound from above the level of the melt in the crucible so as to maintain the second set of composition ratios X of the solute during growth of the multielement compound single crystal.

3. The process as recited in claim 2, wherein the multielement compound is a semiconductor.

4. The process as recited in claim 3, wherein the semiconductor comprises indium gallium antimonide (In, Ga)Sb.

5. The process as recited in claim 3, wherein the semiconductor comprises indium gallium phosphide (In, Ga)P.

6. The process as recited in claim 3, wherein the semiconductor comprises indium gallium arsenide (In, Ga)As.

7. The process as recited in claim 3, wherein the semiconductor comprises indium arsenic phosphide In(As, P).

* * * * *